United States Patent [19]

Yamamichi et al.

[11] Patent Number: 5,332,684
[45] Date of Patent: Jul. 26, 1994

[54] METHOD FOR FABRICATING THIN-FILM CAPACITOR WITH RESTRAINED LEAKAGE CURRENT AT SIDE AND END PORTIONS OF ELECTRODES IN A SEMICONDUCTOR INTEGRATED CIRCUIT DEVICE

[75] Inventors: Shintaro Yamamichi; Toshiyuki Sakuma; Yoichi Miyasaka, all of Tokyo, Japan

[73] Assignee: NEC Corporation, Tokyo, Japan

[21] Appl. No.: 905,375

[22] Filed: Jun. 29, 1992

[30] Foreign Application Priority Data

Jun. 28, 1991 [JP] Japan .................... 3-183496
Aug. 31, 1991 [JP] Japan .................... 3-246995

[51] Int. Cl.$^5$ .................. H01L 21/70; H01L 27/00
[52] U.S. Cl. ................... 437/52; 437/60; 437/919
[58] Field of Search ............. 437/52, 60, 919, 47

[56] References Cited

U.S. PATENT DOCUMENTS 5,079,670  1/1992  Tigelaar ................. 437/47

FOREIGN PATENT DOCUMENTS 0046868  3/1982  European Pat. Off. .
0380326  8/1990  European Pat. Off. .
4107165  10/1991  Fed. Rep. of Germany.

OTHER PUBLICATIONS

"3-Dimensional Stacked Capacitor Cell for 16M and 64M Drams", International Electron Devices Meeting Digest of Technical Papers, 1988; pp. 592–595, by T. Ema, et al.

"High-Perforamnce Tantalum Oxide Capacitors Fabricated By A Novel Reoxidation Scheme", by S. Gi Byeon et al., IEEE Transactions On Electron Devices, vol. 37, No. 4, Apr. 1990, New York, US, pp. 972–979.
T. Ema et al., "3-Dimensional Stacked Capacitor Cell for 16M and 64M Drams", International Electron Devices Meeting Digest of Technical Papers, 1988, pp. 592–595.

Primary Examiner—Olik Chaudhuri
Assistant Examiner—H. Jey Tsai
Attorney, Agent, or Firm—Burns, Doane, Swecker & Mathis

[57] ABSTRACT

A method for fabricating a thin-film capacitor for a semiconductor integrated circuit device includes steps of forming a barrier metal layer, forming a dielectric film, forming an interlayer insulating film, exposing the dielectric film and forming an upper electrode. The thin-film capacitor is fabricated by successively depositing the dielectric film and the upper electrode on a lower electrode. The dielectric film is made of a material having a high permittivity such as $SrTiO_3$. The interlayer insulating film is left at side portions of the lower electrode and the dielectric film. In one aspect of the invention, even if the high permittivity film becomes thin at the side and end portions of the lower electrode, the interlayer insulating film can suppress an increase in a leakage current. In another aspect of the invention, the high permittivity film and lower electrode may be etched successively and collectively and an upper electrode is deposited thereon. It is possible to suppress an occurrence of short-circuiting of the electrodes and an increase in the leakage current at the side portions of the high permittivity film.

9 Claims, 4 Drawing Sheets

METHOD FOR FABRICATING THIN-FILM CAPACITOR WITH RESTRAINED LEAKAGE CURRENT AT SIDE AND END PORTIONS OF ELECTRODES IN A SEMICONDUCTOR INTEGRATED CIRCUIT DEVICE

BACKGROUND OF THE INVENTION (1) Field of the Invention

The present invention relates to a method for fabricating a semiconductor device and, more particularly, to a method for fabricating a thin-film capacitor in a semiconductor integrated circuit.

(2) Description of the Related Art

Conventionally, a thin-film capacitor formed in a semiconductor integrated circuit has a laminated structure of a silicon oxide ($SiO_2$) and a silicon nitride ($Si_3N_4$) with an electrode of polysilicon (also called polycrystalline silicon). In a dynamic random access memory (DRAM) device, a technique of making a capacitor portion after a transistor and a bit line are formed is disclosed in, e.g., "International Electron Devices Meeting Digest of Technical Papers, 1988", pp. 592-595.

The above conventional thin-film capacitor has a limit to the scaling down of the capacitor area in meeting the demand for a higher integration in an integrated circuit in recent years. It is, therefore, necessary to reduce the area of the capacitor portion effectively by means of realization of the thin-film and high permittivity and three-dimensional structure of the dielectric portion of the thin-film capacitor.

The conventional dielectric for forming a capacitor is an $SiO_2$ or a $Si_3N_4$. The permittivity or dielectric constant of these films is at most about 7, so that in order to obtain the required capacitance, a very small film-thickness of 10 nm or less is required in terms of the $SiO_2$ film.

On the other hand, with such a thin film-thickness it is very difficult to realize a dielectric film which has a current-voltage characteristic lower than a tolerable leakage current. An electrode area may be effectively increased if use is made of a three-dimensional structure, but then there will be an increase in the leakage current due to reduction In the dielectric film thickness and concentration of the electric fields at a lower end portion of the electrode.

In order to obviate such a disadvantage, it has been proposed to adopt, as a material for a capacitor portion, $SrTiO_3$ which has a dielectric constant approximately equal to 300 at room temperature, and a dielectric such as $(Ba, Sr)TiO_3$, $Pb(Zr, Ti)O_3$, $Pb(Mg, Nb)O_3$ or $Pb(Mg, W)O_3$ which has a higher dielectric constant, so that the required capacitance can be realized by using a thicker film than the $SiO_2$ film. In this case also, however, an increase in the leakage current is inevitable owing to reduction in the dielectric film thickness and concentration of electric fields at the lower end portion of the electrode formed in a predetermined shape.

SUMMARY OF THE INVENTION

It is, therefore, an object of the present invention overcome the problems existing in the conventional method and to provide a improved method for fabricating a semiconductor device which is capable of restraining an increase in the leakage current at side and end portions of an electrode.

According to one aspect of the invention, there is provided a method for fabricating a semiconductor device including a thin-film capacitor formed by successively depositing a dielectric film and an upper electrode on a lower electrode, the lower electrode protruding from a surface of a first interlayer insulating film deposited on a semiconductor substrate, comprising the steps of:

forming a barrier metal layer on the lower electrode;

forming the dielectric film on an entire surface of the lower electrode and the first interlayer insulating film, the dielectric film being made of a material having a high permittivity;

forming, on an entire surface of the dielectric film, a second interlayer insulating film deposited to the extent that a surface of the dielectric film is buried in the second interlayer insulating layer and that the film thus deposited becomes substantially uniform in height;

removing the second interlayer insulating film by etching until the surface of the dielectric film is exposed thereby forming a flattened surface; and forming the upper electrode on the flattened surface.

According to another aspect of the invention, there is provided a method for fabricating a semiconductor device including a thin-film capacitor formed by successively depositing a dielectric film and an upper electrode on a lower electrode, the lower electrode being formed on a first interlayer insulating film deposited on a semiconductor substrate, comprising the steps of:

forming a barrier metal layer on the lower electrode;

forming the dielectric film at a portion corresponding to the lower electrode, the dielectric film being made of a material represented by a chemical formula of $ABO_3$ where A is at least one of Ba, Sr, Pb, La, Li or K, and B is at least one of Zr, Ti, Ta, Nb, Mg, Mn, Fe, Zn or W;

forming, on an entire surface of the dielectric film, a second interlayer insulating film;

removing the second interlayer insulating film excepting at side portions of the lower electrode, the barrier metal layer and the dielectric film; and forming the upper electrode on the dielectric film.

In the structure formed with the interlayer insulating film partially remaining at the sides of the lower electrode, an increase in the leakage current is suppressed at the side and end portions of the electrode.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Figure 1A:
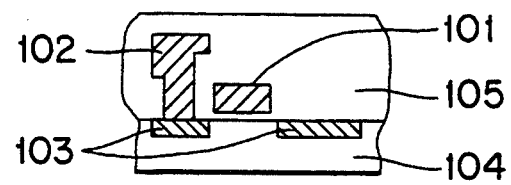
FIGS. 1(a) through 1(e) are diagrams showing the sequence of process steps of a first embodiment according to the present invention.

Now, some preferred embodiments of the present invention will be explained with reference to the accompanying drawings.

Embodiment 1

FIGS. 1(a) through 1(e) show, in sectional views, a memory cell in a DRAM for use in a semiconductor integrated circuit device. The memory cell is composed of a single MOS transistor and a single capacitor. Specifically, FIGS. 1(a) through 1(e) show a process of successively depositing a polysilicon, at least one kind of barrier metal, a high permittivity dielectric, and an upper electrode, after forming a bit line 102, to form a capacitor portion. In the drawings, reference numeral 101 denotes a word line; 102 denotes a bit line; 108 denotes diffused layers corresponding to a source and a drain; 104 denotes a silicon substrate; 105 and 109 denote interlayer insulating films; 106 denotes polysilicon of a lower electrode; 107 denotes a barrier metal layer; 108 denotes a high permittivity film made of, for example, SrTiO$_3$; and 110 denotes an upper electrode.

Figure 1B:
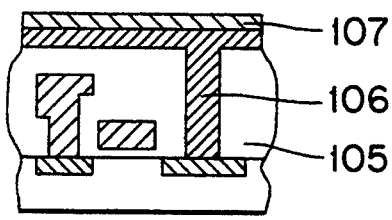

FIG. 1(a) shows, in a sectional view, a transistor for the memory cell. First, as shown in FIG. 1(b), in order to form the lower electrode 108 of a capacitor, a contact hole is opened in the interlayer insulating film 105 by photolithography and plasma etching. The polysilicon 106 is formed in the contact hole to extend onto the interlayer film 105 by low-pressure chemical vapor deposition method (hereinafter referred to as "LPCVD"). Phosphorus (P) is diffused into the polysilicon so that the polysilicon has a low resistance. Tantalum (Ta) and platinum (Pt) are deposited to a thickness of 10~100 nm to form the barrier metal layer 107.

Figure 1C:
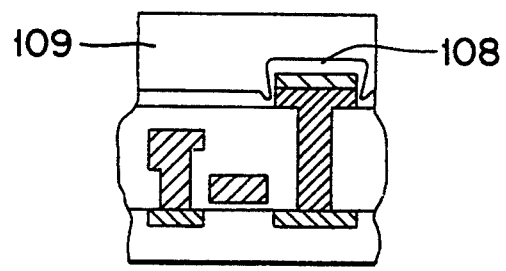
Figure 1D:
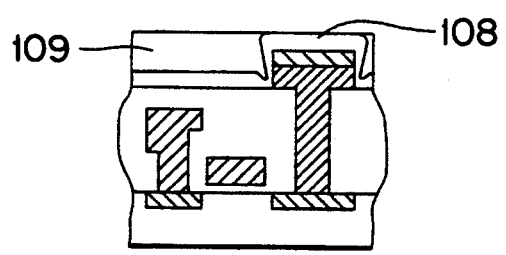

Next, by photolithography and plasma etching, the polysilicon 106 and the barrier metal layer 107 are caused to protrude on the surface and shaped in a predetermined shape. Thereafter, as shown in FIG. 1(c), a high permittivity film 108 made of, for example, SrTiO$_3$ is formed on the entire upper surface by radio-frequency (RF) magnetron sputtering or ion-beam sputtering.

Then, the interlayer insulating film 109 is further formed on a substantially entire upper surface, so that the high permittivity film 108 is buried In the interlayer insulating film. Then, the interlayer film 109 is deposited to a thickness enough to flatten the upper surface substantially. If the surface cannot be flattened sufficiently, an organic insulating film having the same etching rate as the interlayer insulating film 109 is applied to flatten the surface completely. In this state, the entire upper surface is etched by plasma etching using a main gas of CF$_4$. The etching is stopped at the point where the surface of the high permittivity film 108 is exposed, thus leaving the interlayer insulating film 109 in place (FIG. 1(d)).

Figure 1E:
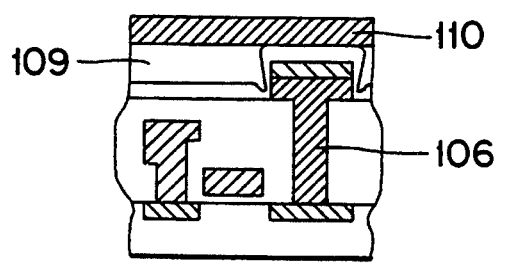

Finally, the upper electrode 110 of titanium nitride (TiN) or aluminum (Al) is formed by plasma-assisted chemical vapor deposition method (hereinafter referred to as "P-CVD") and sputtering, thus completing a capacitor (thin-film capacitor) (FIG. 1(e)). By adopting the fabricating method described above, even when the high permittivity film 108 becomes thin at the side and end portions of the lower electrode 106, the interlayer insulating film 109 can suppress any increase in the leakage current.

Embodiment 2

Like FIG. 1, FIGS. 2(a) through 2(e) show, in sectional views, a memory cell in a DRAM for use in a semiconductor integrated circuit device. The memory cell is composed of a single MOS transistor and a single capacitor. Specifically, FIGS. 2(a) through 2(e) show a process of successively depositing polysilicon, at least one kind of barrier metal layer, a high permittivity dielectric, and an upper electrode, after forming a bit line, to form a capacitor portion. In the drawings, reference numeral 201 denotes a word line; 202 denotes a bit line; 203 denotes diffused layers corresponding to a source and a drain; 204 denotes a silicon substrate; 205 and 209 denote interlayer insulating films; 206 denotes polysilicon of a lower electrode; 207 denotes a barrier metal layer; 208 denotes a high permittivity film made of, e.g., SrTiO$_3$; and 210 denotes an upper electrode.

Figure 2A:
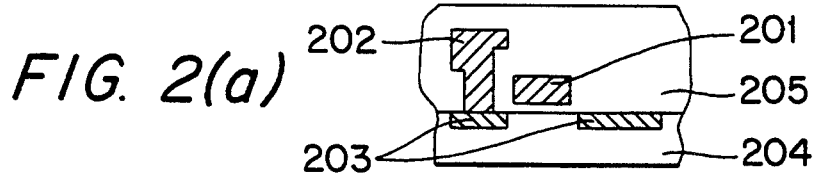
FIGS. 2(a) through 2(e) are diagrams showing the sequence of process steps of a second embodiment according to the present invention.
Figure 2B:
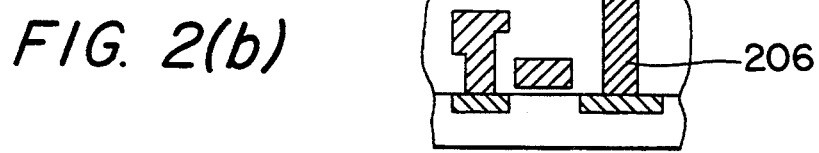
Figure 2C:
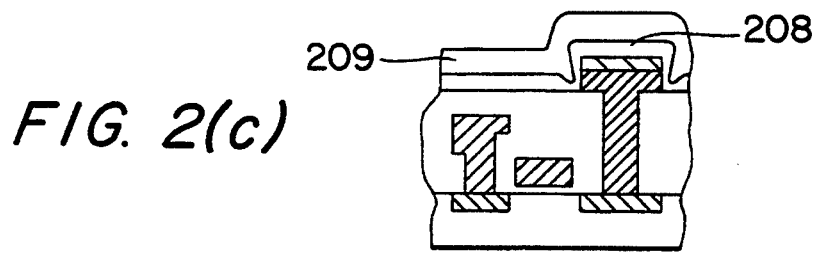
Figure 2D:
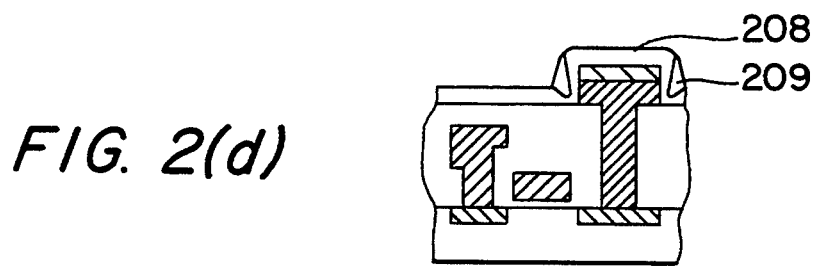

FIGS. 2(a) and 2(b) show entirely the same steps as in FIGS. 1(a) and 1(b) for the first embodiment. In FIG. 2(c), where the interlayer insulating film 209 is formed on a substantially entire surface, it is deposited in conformity with a profile of the protruding high permittivity film 208. It should be noted that the interlayer insulating film 209 is not required to be deposited as thick as in the first embodiment. In this state, the entire upper surface is etched back by plasma etching using a main gas of CF$_4$, so that the interlayer insulating film 209 remains at only the side and end portions of the lower electrode 206 where the high permittivity film 208 was made thin (FIG. 2(d)).

Figure 2E:
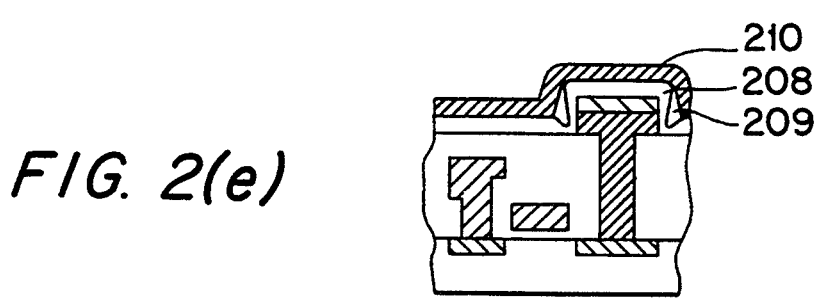

Finally, the upper electrode 210 of titanium nitride (TiN) and aluminum (Al) is formed by P-CVD method and sputtering so as to cover the high permittivity film 208 and the remained interlayer insulating film 209, thus completing a capacitor (thin-film capacitor) (FIG. 2(e)). In accordance with this embodiment, not only the same effect as achieved in the first embodiment can be obtained but also, unlike the first embodiment, it makes it unnecessary to deposit a thick interlayer insulating film and flatten its surface using an organic insulating film. This makes it easy to fabricate the resultant capacitor.

Embodiment 3

FIGS. 3(a) through 3(e), like FIG. 1, show, in sectional views, a memory cell in a DRAM for use in a semiconductor integrated circuit device. The memory cell is composed of a single MOS transistor and a single capacitor. Specifically, FIGS. 3(a) through 3(e) show a process of successively depositing a polysilicon, at least one kind of barrier metal layer, a high permittivity dielectric, and an upper electrode, after forming a bit line, to form a capacitor portion. In the drawings, reference numeral 301 denotes a word line; 302 denotes a bit line; 303 denotes diffused layers corresponding to a source and a drain; 304 denotes a silicon substrate; 305 and 309 denote interlayer insulating films; 306 denotes polysilicon of a lower electrode; 307 denotes a barrier metal layer; 308 denotes a high permittivity film made of, e.g., SrTiO$_3$; and 310 denotes an upper electrode.

Figure 3A:
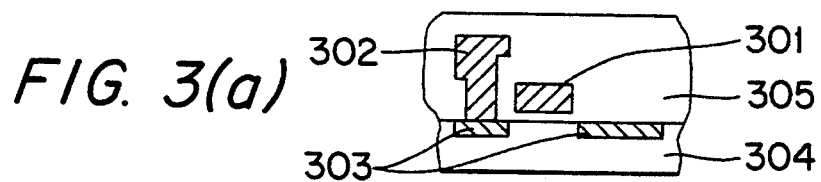
FIGS. 3(a) through 3(e) are diagrams showing the sequence of process steps of a third embodiment according to the present invention.
Figure 3B:
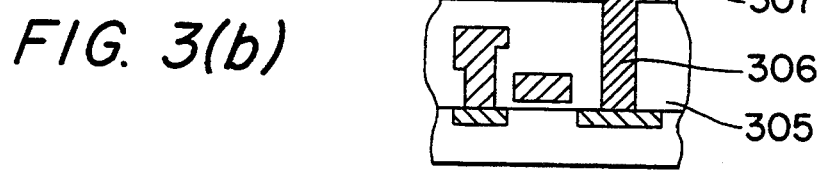
Figure 3C:
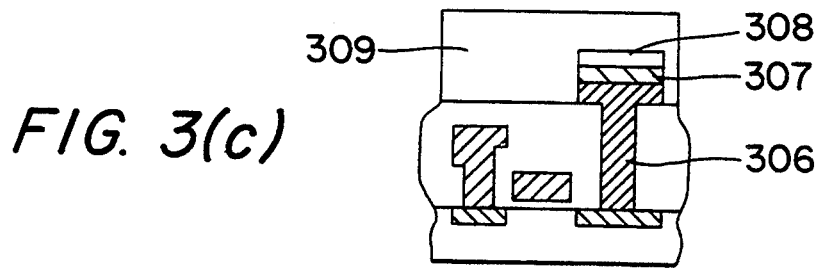
Figure 3D:
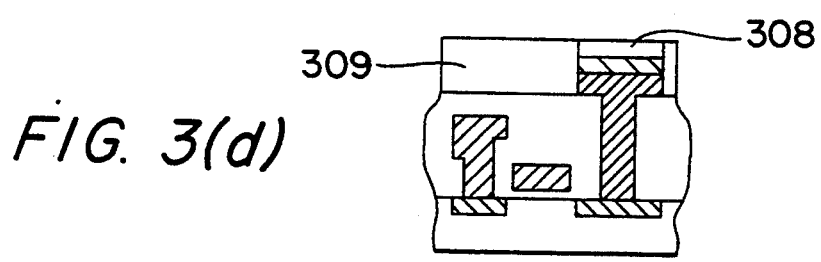

FIG. 3(a) shows a sectional view of the transistor formed for the memory cell. First, as shown in FIG. 3(b), in order to form the lower electrode 306 of a capacitor, a contact hole is opened in the interlayer insulating film 305 by photolithography and plasma etching. The polysilicon 306 is formed in the contact hole to extend onto the interlayer insulating film 305 by the LPCVD method. Phosphorus (P) is diffused into the polysilicon so that the polysilicon has a low resistance. Tantalum (Ta) and platinum (Pt) are deposited to a thickness of 10~100 nm to form the barrier metal layer 307. Further, the high permittivity film 308 is deposited on tile barrier metal layer 307 by the RF magnetron sputtering or ion-beam sputtering.

The high permittivity film 308, the barrier metal layer 307 and the polysilicon 306 are worked successively and collectively into a predetermined shape by photolithography and plasma etching, so that they protrude on the surface corresponding to the contact hole. Thereafter, the interlayer insulating film 309 is further formed on a substantially entire upper surface (FIG. 3(c)).

Then, the interlayer insulating film 309 is deposited to a thickness enough to flatten the surface substantially. If the surface cannot be flattened sufficiently, an organic insulating film having the same etching rate as the interlayer insulating film 309 is applied to flatten the surface completely. In this state, the entire upper surface is etched by plasma etching using a main gas of $CF_4$. The etching is stopped at the point where the surface of the high permittivity film 308 is exposed, thus leaving the interlayer insulating film 309 in place (FIG. 3(d)).

Figure 3E:
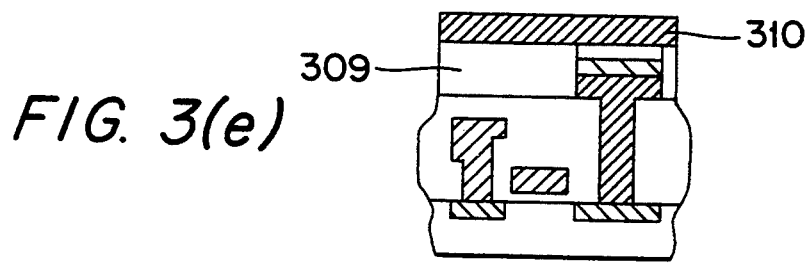

Finally, the upper electrode 310 of titanium nitride (TiN) and aluminum (Al) is formed by P-CVD method and sputtering, thus completing a capacitor (thin-film capacitor) (FIG. 3(e)). The capacitor fabricated according to this embodiment is capable of suppressing an occurrence of short-circuiting between the upper electrode and the side or end portions of the lower electrode and suppressing an increase of the leakage current at the end portions of the high permittivity film.

Embodiment 4

Like FIG. 1, FIGS. 4(a) through 4(e) show, in sectional views, a memory cell in a DRAM for use in a semiconductor integrated circuit device. The memory cell is composed of a single MOS transistor and a single capacitor. Specifically, FIGS. 4(a) through 4(e) show a process of successively depositing a polysilicon, at least one kind of barrier metal layer, a high permittivity dielectric, and an upper electrode, after forming a bit line, to form a capacitor portion. In the drawings, reference numeral 401 denotes a word line; 402 denotes a bit line; 403 denotes diffused layers corresponding to a source and a drain; 404 denotes a silicon substrate; 405 and 409 denote interlayer insulating films; 406 denotes polysilicon of a lower electrode; 407 denotes a barrier metal layer; 408 denotes a high permittivity film made of, e.g., $SrTiO_3$; and 410 denotes an upper electrode.

Figure 4A:
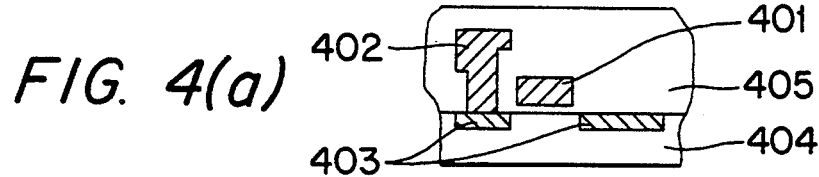
FIGS. 4(a) through 4(e) are diagrams showing the sequence of process steps of a fourth embodiment according to the present invention.
Figure 4B:
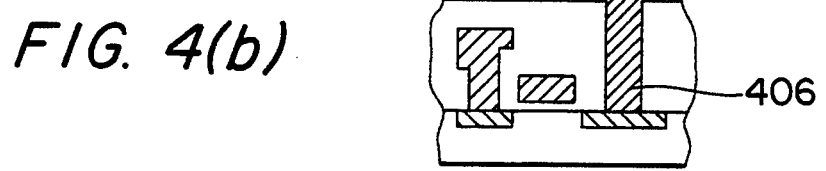
Figure 4C:
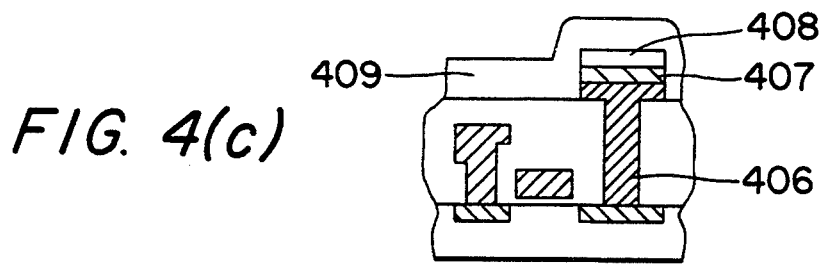
Figure 4D:
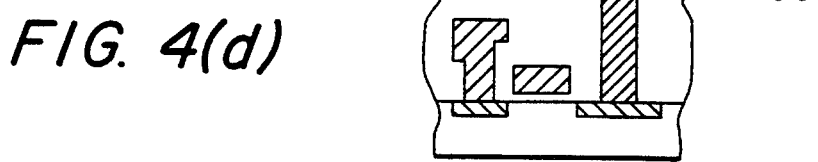

As FIGS. 4(a) and 4(b) show entirely the same steps as in FIGS. 3(a) and 3(b) for the third embodiment, an explanation is not repeated here. In FIG. 4(c), where the interlayer insulating film 409 is formed on a substantially entire upper surface, it is deposited in conformity with a profile of the protruding high permittivity film 408. It should be noted that the interlayer insulating film 408 is not required to be deposited as thick as in the third embodiment. In this state, the entire upper surface is etched back by plasma etching using a main gas of $CF_4$, thereby leaving the interlayer insulating film 409 at only the side and end portions of the lower electrode 406 where the high permittivity film 408 was made thin (FIG. 4(d)).

Figure 4E:
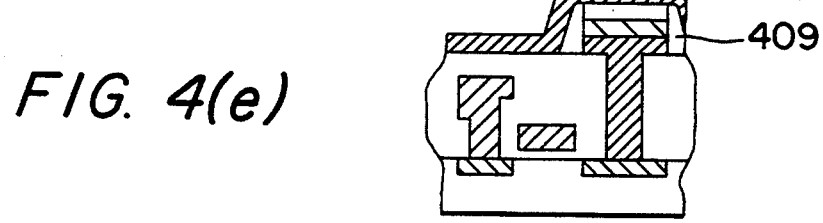

Finally, the upper electrode 410 of titanium nitride (TiN) and aluminum (Al) is formed by P-CVD method and sputtering so as to cover the high permittivity film 408 and the remaining interlayer insulating film 409, thus completing a capacitor (thin-film capacitor) (FIG. 4(e)). In accordance with this fourth embodiment, not only the same effect as achieved in the third embodiment can be obtained but also, unlike the third embodiment, it makes it unnecessary to deposit a thick interlayer insulating film and flatten its surface using an organic insulating film. This makes it easier, as compared to the third embodiment, to fabricate the resultant capacitor.

In the above explained first to fourth embodiments, it should be noted that the high permittivity film may be made of the material other than $SrTiO_3$ which has been focussed hereinabove. The material can be represented by a chemical formula of $ABO_3$ where A contains at least one of Ba, Sr, Pb, La, Li and K, and B contains at least one of Zr, Ti, Ta, Nb, Mg, Mn, Fe, Zn and W. Specifically, the material may be, e.g., $(Ba, Sr)TiO_3$, $PbTiO_3$, $Pb(Zr, Ti)O_3$, $(Pb, La)(Zr, Ti)O_3$, $Pb(Mg, Nb)O_3$, $Pb(Mg, W)O_3$, $Pb(Zn, Nb)O_3$, $LiTaO_3$, $LiNbO_3$, $KTaO_3$, $KNbO_3$, etc. The material may also be $Ta_2O_5$, $Bi_4Ti_3O_{12}$, $BaMgF_4$, etc. which are represented by chemical formulas other than the above.

As understood from the explanation made hitherto, in the first and second embodiments, although the high permittivity film becomes thin at the sides and end portions of the lower electrode, the interlayer insulating film can effectively suppress an increase in a leakage current. Further, since the interlayer insulating thin-film, which has a low permittivity, contributes to the capacitor at only the side portions of the lower electrode, the upper surface of the lower electrode can provide a high capacitance density due to the high permittivity film.

Further, in the third and fourth embodiments, as the upper electrode is deposited after the high permittivity film and lower electrode have been etched successively and collectively, it is possible to effectively suppress an occurrence of short-circuiting between the electrodes or an increase in the leakage current at the end portions of the high permittivity film.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating a semiconductor device including a thin-film capacitor formed by successively depositing a dielectric film and an upper electrode on a lower electrode, said lower electrode being formed on a first interlayer insulating film deposited on a semiconductor substrate, comprising the steps of:

forming a barrier metal layer on the lower electrode;

forming said dielectric film at a portion corresponding to said lower electrode, said dielectric film being made of a material represented by a chemical formula of $ABO_3$ wherein A is at least one of Ba, Sr, Pb, La, Li, or K, and B is at least one of Zr, Ti, Ta, Nb, Mg, Mn, Fe, Zn, or W;

forming a second interlayer insulating film on a surface of said dielectric film;

removing said second interlayer insulating film except at side portions of said lower electrode, said barrier metal layer and said dielectric film; and forming said upper electrode on said dielectric film.

2. A method for fabricating a semiconductor device including a thin-film capacitor formed by successively depositing a dielectric film and an upper electrode on a lower electrode, said lower electrode protruding from a surface of a first interlayer insulating film deposited on a semiconductor substrate, comprising the steps of:
   forming a barrier metal layer on the lower electrode;
   forming said dielectric film on an entire surface of said lower electrode and said first interlayer insulating film, said dielectric film being made of a material having a dielectric constant;
   forming a second interlayer insulating film deposited on a surface of said dielectric film to the extent that a surface of said dielectric film is buried in said second interlayer and that the film thus deposited becomes substantially uniform in height;
   removing said second interlayer insulating film by etching until the surface of said dielectric film is exposed thereby forming a flattened surface; and
   forming said upper electrode extending entirely on said flattened surface.

3. A method for fabricating a semiconductor device including a thin-film capacitor formed by successively depositing a dielectric film and an upper electrode on a lower electrode, said lower electrode protruding from a surface of a first interlayer insulating film deposited on a semiconductor substrate, comprising the steps of:
   forming a barrier metal layer on the lower electrode;
   forming said dielectric film on an entire surface of said lower electrode and said first interlayer insulating film, said dielectric film being made of a material having a dielectric constant;
   forming a second interlayer insulating film deposited on said dielectric film in conformity with a profile of said dielectric film until a surface of said dielectric film is buried in said second interlayer insulating layer;
   removing said second interlayer insulating film by etching-back with said second interlayer insulating film partly remaining at only side portions of said dielectric film; and
   forming said upper electrode extending entirely on surfaces of said dielectric film and said second interlayer insulating film partly remaining.

4. A method for fabricating a semiconductor device including a thin-film capacitor formed by successively depositing a dielectric film and an upper electrode on a lower electrode, said lower electrode protruding from a surface of a first interlayer insulating film deposited on a semiconductor substrate, comprising the steps of:
   forming a barrier metal layer on the lower electrode;
   forming said dielectric film only at a portion corresponding to said lower electrode, said dielectric film being made of a material having a dielectric constant;
   forming a second interlayer insulating film deposited on said dielectric film and said first interlayer insulating film to the extent that a surface of said dielectric film is buried in said second interlayer insulating layer and that the film thus deposited becomes substantially uniform in height;
   removing said second interlayer insulating film by etching until the surface of said dielectric film is exposed thereby forming a flattened surface; and
   forming said upper electrode on said flattened surface.

5. A method for fabricating a semiconductor device including a thin-film capacitor formed by successively depositing a dielectric film and an upper electrode on a lower electrode, said lower electrode protruding from a surface of a first interlayer insulating film deposited on a semiconductor substrate, comprising the steps of:
   forming a barrier metal layer on the lower electrode;
   forming said dielectric film only at a portion corresponding to said lower electrode, said dielectric film being made of a material having a dielectric constant;
   forming a second interlayer insulating film deposited on said dielectric film and said first interlayer insulating film in conformity with a profile of said dielectric film until a surface of said dielectric film is buried in said second interlayer insulating layer;
   removing said second interlayer insulating film by etching-back with a second interlayer insulating film partly remaining at only side portions of said dielectric film; and
   forming said upper electrode extending entirely on surfaces of said dielectric film and said second interlayer insulating film partly remaining.

6. A method for fabricating a semiconductor device according to claim 2, 3, 4 or 5, in which said dielectric film is made of a material represented by a chemical formula of $ABO_3$ wherein A is at least one of Ba, Sr, Pb, La, Li, or K, and B is at least one of Zr, Ti, Ta, Nb, Mg, Mn, Fe, Zn, or W.

7. A method for fabricating a semiconductor device according to claim 2, 3, 4 or 5, in which said dielectric film is made of a material represented by a chemical formula of $ABO_3$ wherein A is at least one of Ba, Sr, Pb, La, or Li and B is at least one of Zr, Ti, Ta, or Nb.

8. A method for fabricating a semiconductor device according to claim 2, 3, 4 or 5, wherein said dielectric film is made of a material selected from the group consisting of $(Ba, Sr)TiO_3$, $PbTiO_3$, $Pb(Zr, Ti)O_3$, $(Pb, La)(Zr, Ti)O_3$, $Pb(Mg, Nb)O_3$, $Pb(Mg, W)O_3$, $Pb(Zn, Nb)O_3$, $LiTaO_3$, $LiNbO_3$, $KTaO_3$ and $KNbO_3$.

9. A method for fabricating a semiconductor device according to claim 2, 3, 4 or 5, wherein said dielectric film is made of a material selected from the group consisting of $Ta_2O_5$, $Bi_4Ti_3O_{12}$ and $BaMgF_4$.

* * * * *